US006629288B1

(12) United States Patent
Bernath et al.

(10) Patent No.: US 6,629,288 B1
(45) Date of Patent: Sep. 30, 2003

(54) SINGLE CLOCK CYCLE CRC ENGINE

(75) Inventors: Brett A. Bernath, San Diego, CA (US); John M. Brooks, Longmont, CO (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/516,373

(22) Filed: Mar. 1, 2000

(51) Int. Cl.[7] .............................................. H03M 13/09
(52) U.S. Cl. ...................................................... 714/807
(58) Field of Search ................................ 714/805, 757, 714/807

(56) References Cited

U.S. PATENT DOCUMENTS

| | | | | |
|---|---|---|---|---|
| 4,991,133 A | * | 2/1991 | Davis et al. ................. | 709/234 |
| 5,414,707 A | * | 5/1995 | Johnston et al. ......... | 370/395.51 |
| 5,638,370 A | * | 6/1997 | Seconi et al. ................ | 370/466 |
| 5,790,786 A | * | 8/1998 | Wakeman et al. .......... | 370/363 |
| 5,951,707 A | * | 9/1999 | Christensen et al. ........ | 370/466 |
| 6,311,204 B1 | * | 10/2001 | Mills ........................... | 345/502 |
| 6,385,751 B1 | * | 5/2002 | Wolf ............................ | 714/784 |
| 6,438,678 B1 | * | 8/2002 | Cashman et al. ............ | 709/230 |

OTHER PUBLICATIONS

McGoldrick, "Super chip is the first to get the cable modem down to size," *Electronic Design*, pp. 67–74, Jun. 9, 1997.

* cited by examiner

*Primary Examiner*—Stephen M. Baker
(74) *Attorney, Agent, or Firm*—Christopher J. Rourk; Akin Gump Strauss Hauer & Feld, LLP (57) ABSTRACT

A communication device, such as a cable modem, having a programmable media access controller (MAC) supported by a programmable CRC engine. The CRC engine computes CRC values for data written to it by the programmable MAC or other software process, thereby relieving processing circuitry of these computationally burdensome functions. The programmable nature of the CRC engine permits compliance with a wide variety standards, including evolving standards such as DOCSIS, without requiring expensive hardware upgrades. In one embodiment of the invention, the CRC engine may be initialized by the programmable MAC with an initial vector prior to CRC computations. The programmable MAC or other software then locates the data bytes (e.g., data frame header data) for which a CRC is to be computed. This information is written to a data register of the CRC engine and a CRC operation is performed. Based on the results, the programmable MAC may determine whether the CRC operation indicates valid data. For example, the CRC value may be compared to value communicating a frame header for purposes of validating received data frames. The CRC engine may advantageously utilize one or more polynomials as determined by the programmable MAC. Further, the CRC engine of the disclosed embodiment may receive data of varying sizes such that write processes may be optimized.

27 Claims, 5 Drawing Sheets

SINGLE CLOCK CYCLE CRC ENGINE

INCORPORATIONS BY REFERENCE

The following commonly-assigned patent applications are hereby incorporated by reference in their entirety, including drawings and appendices, and are hereby made part of this application for all purposes:

1) U.S. Provisional Application Ser. No. 60/183,130, filed Feb. 17, 2000, entitled "Cable Modem Having a Programmable Media Access Controller";
2) U.S. patent application Ser. No. 09/516,096, filed on even date herewith, entitled "Method For Reassembling Fragmented MAC Frames From Transport Layer Frames While Performing Decryption/CRC Operations";
3) U.S. patent application Ser. No. 09/409,820, filed Sep. 30, 1999, entitled "Asochronous Centralized Multi-Channel DMA Controller"; and
4) U.S. patent application Ser. No. 09/410,167, filed Sep. 30, 1999, entitled "System And Method For Providing An Improved Synchronous Operation Of An Advanced Peripheral Bus With Backward Compatibility".

FIELD OF THE INVENTION

The present invention relates generally to a communication device; and, more particularly, it relates to a method for efficiently performing Header Check Sequence (HCS) operations in a cable modem having programmable MAC functionality.

BACKGROUND OF THE INVENTION

In recent years, cable television networks have become widespread. A typical cable television system can carry many television stations, and is effectively a high bandwidth system. Because of the increasing availability of cable television infrastructure, the use of television cables as the medium for computer data networks has the potential for giving users high bandwidth at a reasonable cost. A cable television system, however, requires several enhancements in order to function as a data network.

In its classic form, a cable television system carries information in only one direction—from the cable system headend to the individual user. The user interface to the system generally comprises a receiver such as a television or a stereo. The headend transmits television or stereo channels simultaneously. In general, the user has no influence on what is transmitted and can only choose among the channels the headend is transmitting.

In contrast, a data network carries data from the headend to the user (the downstream path) and from the user to the headend (the upstream path). The individual user requires equipment, such as a cable modem, that can both receive from the headend and transmit to it. A cable data network must be able to handle many individual users simultaneously, each of whom have control over what they receive and transmit.

Cable modems offer greatly improved bandwidth capable of delivering services hundreds, or even thousands, of times faster than conventional modems. Cable modems can achieve data-transfer rates of up to 40 Mbits/s by connecting directly to coaxial lines as opposed to dial-in modems that use twisted-pair copper telephone lines.

In order for a cable television network to operate as a data network, it requires a headend capable of both transmitting and receiving data. To ensure that each user receives the data they require, a network protocol must be implemented to allow independent users of the network to utilize the shared headend and the distribution network without interference from or receiving the data of other users.

The network protocol places requirements on both the headend and the user end. Generally, the headend serves as the network controller, and the user's cable modem must be able to respond to commands from the headend. In cable modems adhering to the well-known OSI reference model, the lowest layer is the Physical layer (PHY), while the next layer up is the Data Link layer. The Data Link layer is segmented into two parts, the Medium Access Controller (MAC), which interfaces with the PHY, and the Logical Link Control (LLC), which interfaces to the MAC and to higher layers. In general, the MAC and LLC provide the following Data Link functionality: transmit and receive data encapsulation, including framing (frame boundary delineation, frame synchronization), addressing (management of source and destination address), and error detection (detection of physical medium transmission errors); and media access management, including collision avoidance and handling. A physical address or MAC address is a unique Data Link layer address that is assigned to every port or device that connects to a network. Other devices in the network use these addresses to locate specific ports in the network and to create and update routing tables and data structures.

In an effort to coordinate the development of multimedia high-speed data services and the interoperability of network devices, cable operators have formed the Multimedia Cable Network Systems (MCNS) Group in cooperation with the industry research and development consortium CableLabs. The MCNS group has promulgated the Data Over Cable Service Interface Specification (DOCSIS). Other standards utilizing transport frames, such as DAVIC/DVB, have likewise been created. Such standards continue to evolve over time, with the frequent inclusion of additional feature sets. In specifications such as DOCSIS, MAC-layer frames are encapsulated in transport-layer frames, such as MPEG frames.

The term "cable modem termination system" (CMTS) generally refers to a cable bridge or cable router in the cable head-end. A CMTS acts as the master station in a DOCSIS-compliant cable data system. The CMTS is generally the only station that transmits downstream, and it controls the scheduling of upstream transmissions by associated cable modems.

Cyclic-redundancy-checks (CRC) computations are generally performed on data received by applications supported by cable modems. For example, on the transmitting side, the CMTS typically computes a CRC value for frame headers. The CRC may be appended to the end of the header of each frame prior to transmission. On the receiving end, the cable modem extracts the header data and a CRC value is computed. This computed CRC value is then compared to the received CRC value appended to the header. If the values match, the header is assumed to be a valid header free of transmission errors. Even though a relatively small amount of data (e.g., 6–8 bytes) is involved, such CRC operations are very bit intensive and computationally difficult to perform in software.

Previously, cable modem devices have only included a fixed-function MAC in which a hardware state machine performs all functions on data as it arrives, including CRC operations. These devices are generally compliant with a single specification or a version of a specification. Thus, any changes to the underlying specification require concomitant hardware modifications, resulting in lengthy and expensive product development cycles.

SUMMARY OF THE INVENTION

Briefly, the present invention relates to a communication device, such as a cable modem, having a programmable media access controller (MAC) supported by a programmable CRC engine. The CRC engine computes CRC values for data written to it by the programmable MAC, thereby relieving the MAC processing circuitry of these bit-intensive computations. Use of the CRC engine thus improves the overall performance of a cable modem incorporating programmable MAC or similar functionality. The programmable nature of the CRC engine further permits compliance with a wide variety of standards, including evolving standards such as DOCSIS, without requiring expensive hardware upgrades.

In one embodiment of the invention, the CRC engine may be initialized by the programmable MAC with an initial vector prior to CRC computations. The programmable MAC or other software then locates the data bytes for which a CRC needs to be computed and forwards the information to the CRC engine. Based on the results, the programmable MAC may determine whether the CRC passed or failed. For example, the CRC value may be compared to a value communicated in a frame header for purposes of validating received data frames.

The CRC engine may advantageously utilize one or more polynomials as determined by the programmable MAC or other system componentry. Further, the CRC engine of a disclosed embodiment may receive data of varying sizes (e.g., 4-byte, 8-byte, 32-byte) such that write processes may be optimized.

The programmable CRC engine thus improves the performance of a cable modem incorporating programmable MAC functionality by moving computationally burdensome functions to hardware while keeping control functions within software. Further, the programmable nature of the CRC engine provides flexibility to support a variety of different MACs and data frame types.

BRIEF DESCRIPTION OF THE DRAWINGS

A better understanding of the present invention can be obtained when the following detailed description of an exemplary embodiment is considered in conjunction with the following drawings, in which.

DETAILED DESCRIPTION OF THE INVENTION

Figure 1:
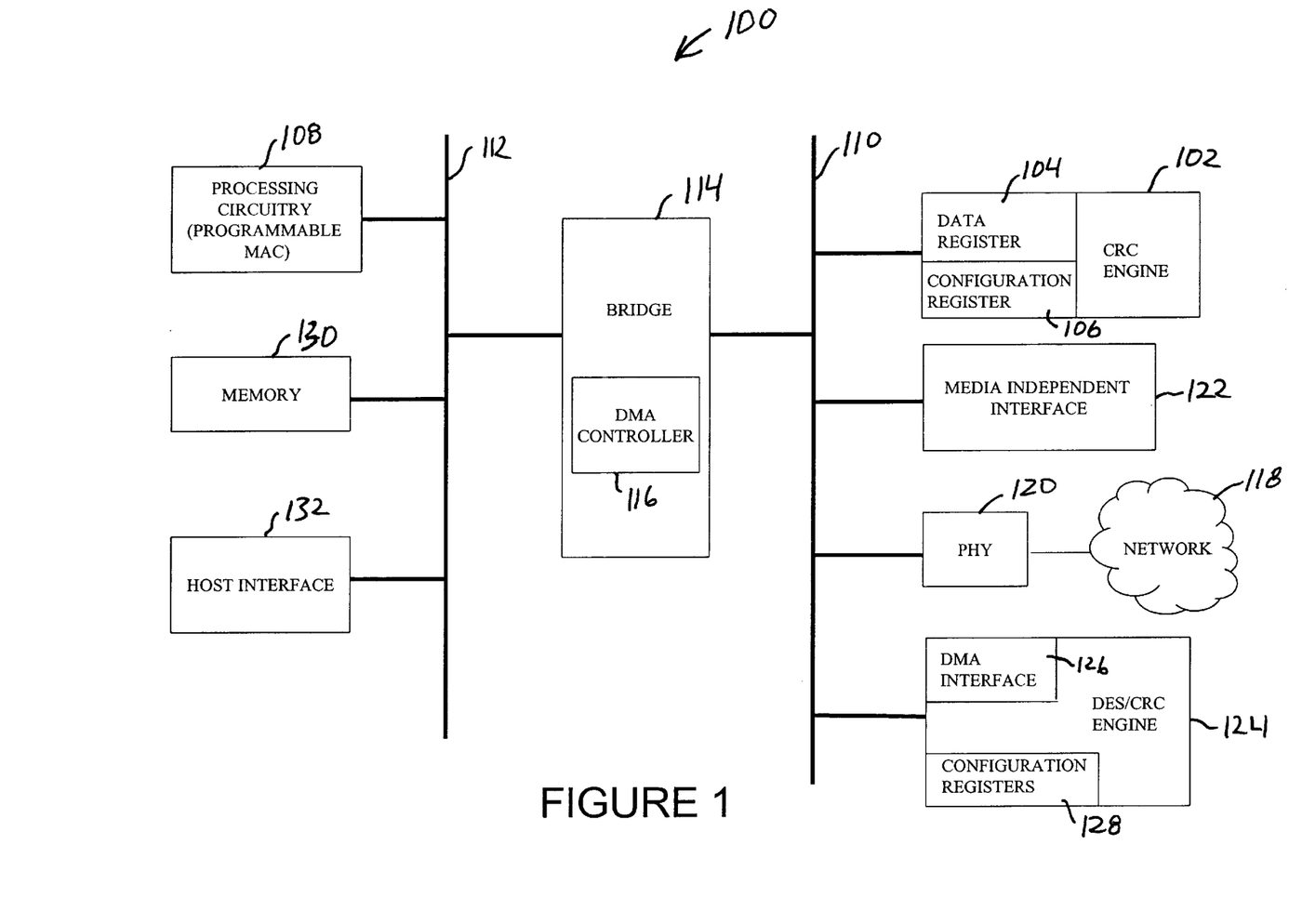
FIG. 1 is a block diagram of an exemplary cable modem having a programmable media access controller and CRC engine according to the present invention.

FIG. 1 is a block diagram of an exemplary cable modem 100 having a programmable media access controller and CRC engine according to the present invention. The cable modem 100 of the disclosed embodiment receives transport-layer frames that encapsulate fragmented MAC frames. The CRC engine 102 may be programmed by the programmable MAC to validate header information relating to received frames. The programmable CRC engine 102 enhances the performance of a cable modem 100 incorporating programmable MAC functionality by moving computationally intensive functions to hardware while keeping control functions within software. The programmable nature of the CRC engine 102 permits it to support evolving standards, such as DOSCIS, without the requirement of concomitant hardware upgrades.

The disclosed communication device, taking the form of a cable modem 100, can be implemented in a variety of products, including external or internal cable modems with Ethernet and/or USB connections, multifunction home-networking products, interactive set-top-box solutions, digital satellite receivers, wireless networking devices having antennas, Small Office/Home Office (SOHO) equipment and Internet Protocol (IP) telephony products. Accordingly, various embodiments of the invention may interface with non-traditional "cable" media (e.g., any type of media capable of transporting MPEG packets), and the precise nature of the data transmission media is not considered critical to the invention. The cable modem 100 may be compliant with any of a number of standards, including but not limited to, DOCSIS, DAVIC/DVB (Digital Video Broadcasting) and Voice Over IP (VOIP) standards. The disclosed circuitry may be part of single integrated circuit, or a combination of integrated circuits. Alternatively, host system circuitry may be leveraged to perform certain of the programmable MAC functions described herein.

In the cable modem 100 illustrated in FIG. 1, the CRC engine 102 is provided to perform single-cycle computations on input data of variable length. The CRC engine 102 may be utilized, for example, to provide high-performance Header Check Sequence (HCS) calculations as used in both downstream and upstream MAC operations, and may receive data directly from the programmable MAC via a data register 104.

In one embodiment of the invention, a configuration register 106 of the CRC engine 102 is initialized by a programmable MAC 108 with an initial vector prior to CRC computations. The programmable MAC 108 or other software then locates the data bytes for which a CRC needs to be computed and forwards the information to the CRC engine 102. Based on the results, the programmable MAC 108 may determine whether the CRC passed or failed. The CRC engine 102 may advantageously utilize one or more polynomials as determined by the programmable MAC 108 or other system componentry. Further, the CRC engine 102 of a disclosed embodiment may receive data of varying sizes (e.g., 4-byte, 8-byte, 32-byte) such that write processes may be optimized. Exemplary operation of the CRC engine 102 is discussed more fully below in conjunction with FIGS. 3A, 3B and 4.

In the disclosed embodiment of the invention, processing circuitry 108 (referred to herein as programmable MAC 108) is programmed to implement the desired MAC functionality. The programmable MAC 108 is designed for high-performance data processing. The programmable MAC 108 may also provide operating system support and manage some message processing and scheduling. It is contemplated that the programmable MAC 108 may include a plurality of processor cores in which operating system and MAC functionality are separated. One such implementation, as well as further details of contemplated cable modem circuitry, may be found in a previously-incorporated U.S. patent application Ser. No. 60/183,130, entitled "Cable Modem Having a Programmable Media Access Controller". Alternatively, host system circuitry may perform the programmable MAC functions.

Bi-directional communication between the cable modem 100 and an external communication network 118 is conducted by physical layer (PHY) circuitry 120 coupled to the peripheral bus 10. As will be appreciated by those skilled in the art, the PHY circuitry 120 may perform modulation, demodulation, and forward error correction functions on both upstream and downstream data frames.

A programmable DES/CRC engine 124 is also provided for reassembling fragmented MAC frames. The DES/CRC engine 124 is capable of performing DES encryption or decryption, and/or frame-length CRC operations on a stream of data supplied by a DMA controller 116. The DES/CRC engine 124 includes a plurality of a configuration registers 128 for receiving programming information from other system components. The configuration registers 128 may store a wide range of information. For example, DES keys, CRC vectors, and pointers to buffered frame fragments and destination buffers may be loaded into the configuration registers 128. In addition, the DES/CRC engine 124 of this embodiment of the invention includes a DMA interface 126 for coordinating the transfer of information to and from memory buffers. Additional DES/CRC engines 124 may be provided to permit a plurality of data flow threads to be processed simultaneously or to permit processing of interleaved data. Although the disclosed embodiment utilizes the well-known DES algorithm, it will be appreciated that the cable modem 100 could be configured to use various other public and proprietary encryption/decryption algorithms.

The programmable MAC 108 may specify processing control for each separate frame fragment. The DES/CRC engine 124 operates in conjunction with the DMA controller 116 to pull in fragments of data from varying memory segments with possibly different byte alignments, processes the segments (DES and/or CRC) as if the data were a continuous frame, and then sends the processed data frame back to a contiguous memory segment. The DES/CRC engine 124 can operate in at least three modes; no DES, CRC generation or checking; decryption, CRC checking; and encryption, CRC generation. The desired mode may be selected by writing to a field of the configuration registers 128. Additionally, in encryption mode, the DES/CRC engine 124 may encrypt and impend a calculated CRC to the output data.

The DES/CRC engine 124 receives the MAC frame one fragment at a time. It is possible for the MAC frame to be delivered in one, two, or three or more fragments, thus creating various control and data flow setup conditions. The programmable MAC functionality assists the processing of each fragment of the MAC frame by programming control information into the appropriate configuration register 128 on both a fragment as well as a frame basis.

In one embodiment of the invention, the programmable MAC 108 sets a bit in the configuration registers 128 at the beginning of each frame to initialize processing. This bit is cleared by the DES/CRC engine 124 at the end of processing the first fragment. A frame length value is also provided to the configuration registers 128 at the beginning of each frame. This value tells the DES/CRC engine 124 how many total bytes there are for all of the expected fragments to be processed for a given frame. A frame length value may also be provided, and is decremented as data is processed. The frame length value may be utilized for determining the number of bytes remaining in the frame, assuming the firmware updates the frame length value following each fragment. Incoming fragments are processed and sent out to a contiguous memory segment. Further details regarding the DES/CRC engine 124 may be found in a previously-incorporated U.S. patent application Ser. No. 09/516,096, entitled "Method For Reassembling Fragmented MAC Frames From Transport Layer Frames While Performing Decryption/CRC Operations."

The CRC engine 102, as well as other circuitry described below, are coupled to a peripheral bus 110. The peripheral bus 110 of the disclosed embodiment of the invention is linked to a system bus 112 via bridge circuitry 114. The bridge circuitry 114 comprises a centralized multi-channel DMA controller 116 for facilitating the movement of data in the cable modem 100. The bridge 114 may serve as master of both a system bus 112 and peripheral bus 110, and utilizes burst transfers and pipelining of data to optimize bus efficiency. The DMA controller 116 of the disclosed embodiment is constructed to provide lower data latency, minimal data buffering, guaranteed data bandwidth, and asochronous demand support. Further details of one such DMA controller and associated circuitry may be found in previously-incorporated U.S. patent application Ser. No. 09/409,820, "Asochronous Centralized Multi-Channel DMA Controller" and U.S. patent application Ser. No. 09/410,167, filed Sep. 30, 1999, entitled "System And Method For Providing An Improved Synchronous Operation Of An Advanced Peripheral Bus With Backward Compatibility." In the disclosed embodiment of the invention, the peripheral bus 110 provides the basic peripheral macrocell communications infrastructure. Such peripherals typically have interfaces which are memory-mapped registers, have few high-bandwidth interfaces, and are accessed under program control (such as the programmable MAC).

The peripheral bus 110 and system bus 112 may comply with a wide variety of bus specifications and architectures. Accordingly, the programmable MAC 108 may be configured to operate with many different types of buses and interface with many types of peripheral devices. For example, in a host processor-based implementation, the system bus may take the form of a PCI bus or any other type of bus typically found in computer systems.

In one embodiment of the invention, the cable modem 100 utilizes the Advanced System Bus (ASB) and Advanced Peripheral Bus (APB) protocols and bus architectures as specified in the Advanced Microcontroller Bus Architecture (AMBA) specification. The AMBA specification defines an on-chip communication standard for designing high-performance embedded micro-controllers. The ASB is generally utilized for high-performance system modules, supporting the efficient connection of processors, on-chip memories, and off-chip external memory interfaces with low-power peripheral/macrocell functions. The APB is optimized for minimal power consumption and reduced interface complexity in supporting peripheral functions.

Another bus defined by AMBA is the Advanced High-Performance Bus (AHB). The AHB is generally utilized with high-performance, high-frequency system modules. Either the ASB or AHB may be utilized as the system bus 112, while the APB may be utilized as the peripheral bus 110. The system bus 112 functions to provide a high-bandwidth interface between system elements, such as memory 130, that are involved in the majority of data transfers.

The cable modem 100 of FIG. 1 may also include a number of optional interfaces for communicating with a host system or external devices. For example, a host system interface 132 and external/internal memory 130 may be provided on the system bus 112. Likewise, the peripheral bus 110 may support Media Independent Interface (MII) 122, as well as a General Purpose Input/Output (GPIO) interface, USB port, and a UART port (not shown). A number of other peripherals may also be coupled to the peripheral bus 110. As will be appreciated, many other types of circuits and interfaces may be provided on the system bus 112 and peripheral bus 110 and the precise nature of supported devices is not considered critical to the invention.

The MII 122 may comprise an Ethernet Media Access Controller (EMAC). In one contemplated embodiment, the EMAC supports the MAC sub-layer of the IEEE space 802.3 specification and allows it to be connected to an IEEE 802.3 10/100 Mbps (100 Base-T and 10 Base-T) MII compatible EPHY device or seven-wire HomeLan PHY device. The MII 122 provides a port to transmit and receive data that is media independent, multi-vendor interoperable, and supports all data rates and physical standards. The port consists of data paths that are generally four bits wide in each direction, as well as control and management signals. The MII 122 can be configured as a glueless connection to support Ethernet or HomeLan serial mode.

Figure 2:
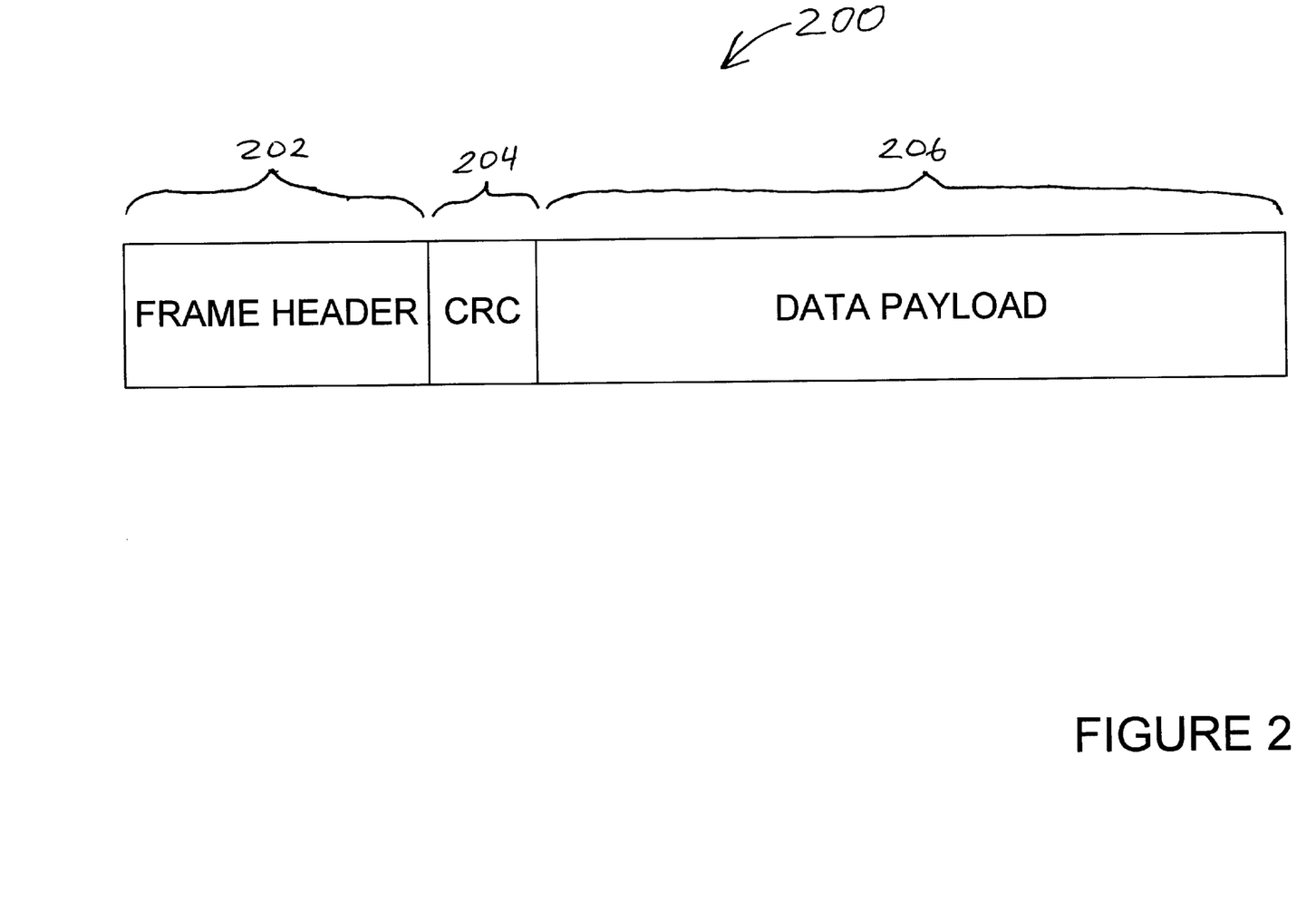
FIG. 2 illustrates an exemplary transport-layer frame having header information that is validated by the cable modem of FIG. 1 in accordance with the present invention.

FIG. 2 illustrates an exemplary data frame 200 having header information that is validated by the cable modem 100 in accordance with the present invention. The data frame 200 has various fields, including a frame header 202, a CRC 204, and a data payload field 206. As will be appreciated by those skilled in the art, the data frame 200 may comply with a variety of standards. For example, the data frame 200 may be an MCNS frame, an ATM frame, or any other type of frame suitable for carrying a data payload. In addition, the data frame 200 may be of fixed or variable length depending on the precise implementation of the cable modem 100.

The frame header 202 generally includes n bytes of control and address information for identifying the destination of the frame, the center of the frame, and the type of data carried by the frame. As previously mentioned, a CRC value 204 is typically appended to the frame header 202. In the disclosed embodiment of the invention, the frame header 202 is provided to the CRC engine 102. The CRC value 204 is compared with the output of the CRC engine 102 for purposes of validating the frame header 202.

Various types of information may be contained in the data payload field 206. For example, in a DOCSIS-compliant system, the data payload field 206 will include MCNS frame information. MCNS frames may be contained within one or more consecutive MPEG frames. As will be appreciated, the CRC engine 102 may be configured to perform CRC operations on information (such as MCNS or ATM headers) contained within the data payload field 206.

Figure 3A:
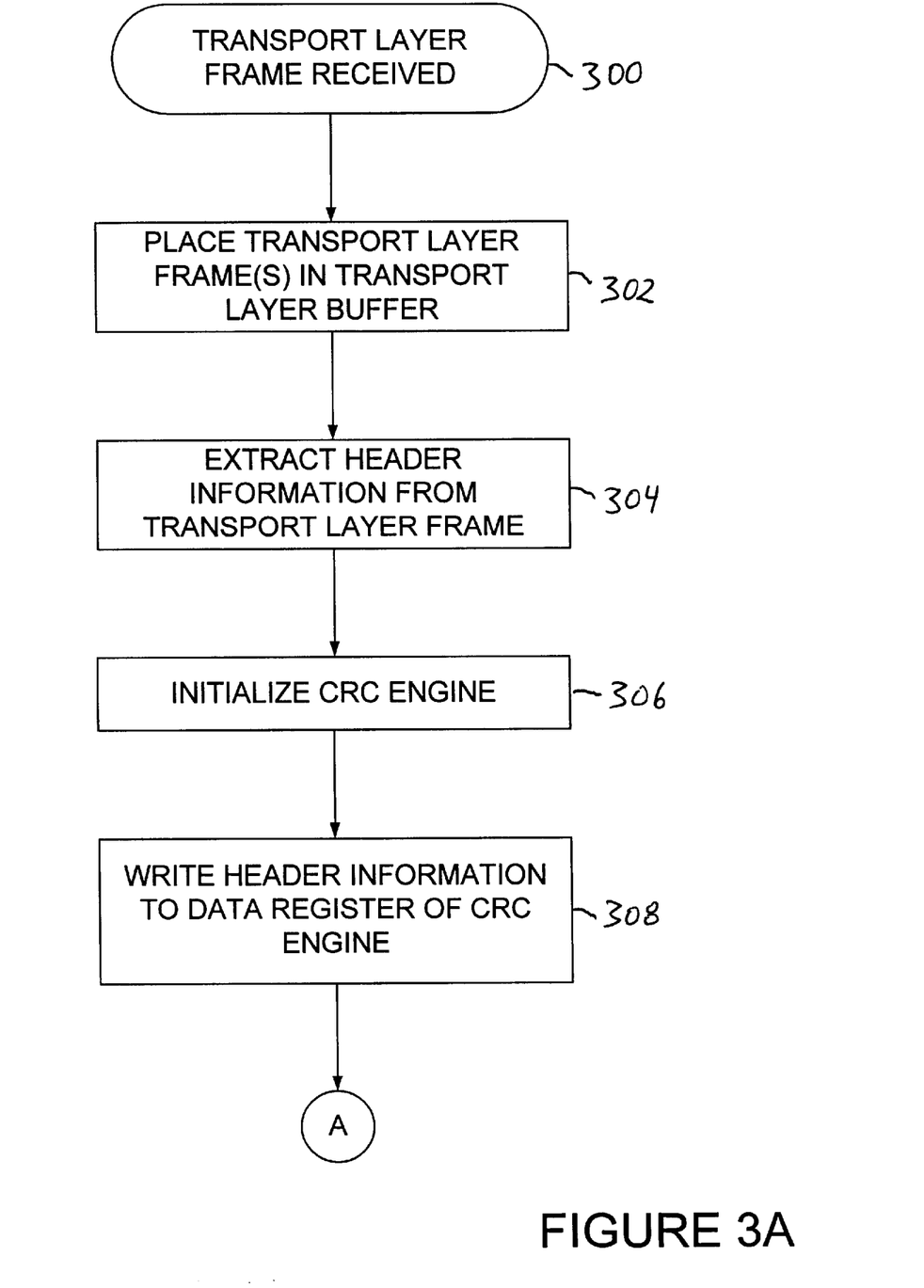
FIGS. 3A and 3B are flow diagrams of an exemplary frame header validation process performed by the cable modem of FIG. 1 in accordance with the present invention.
Figure 3B:
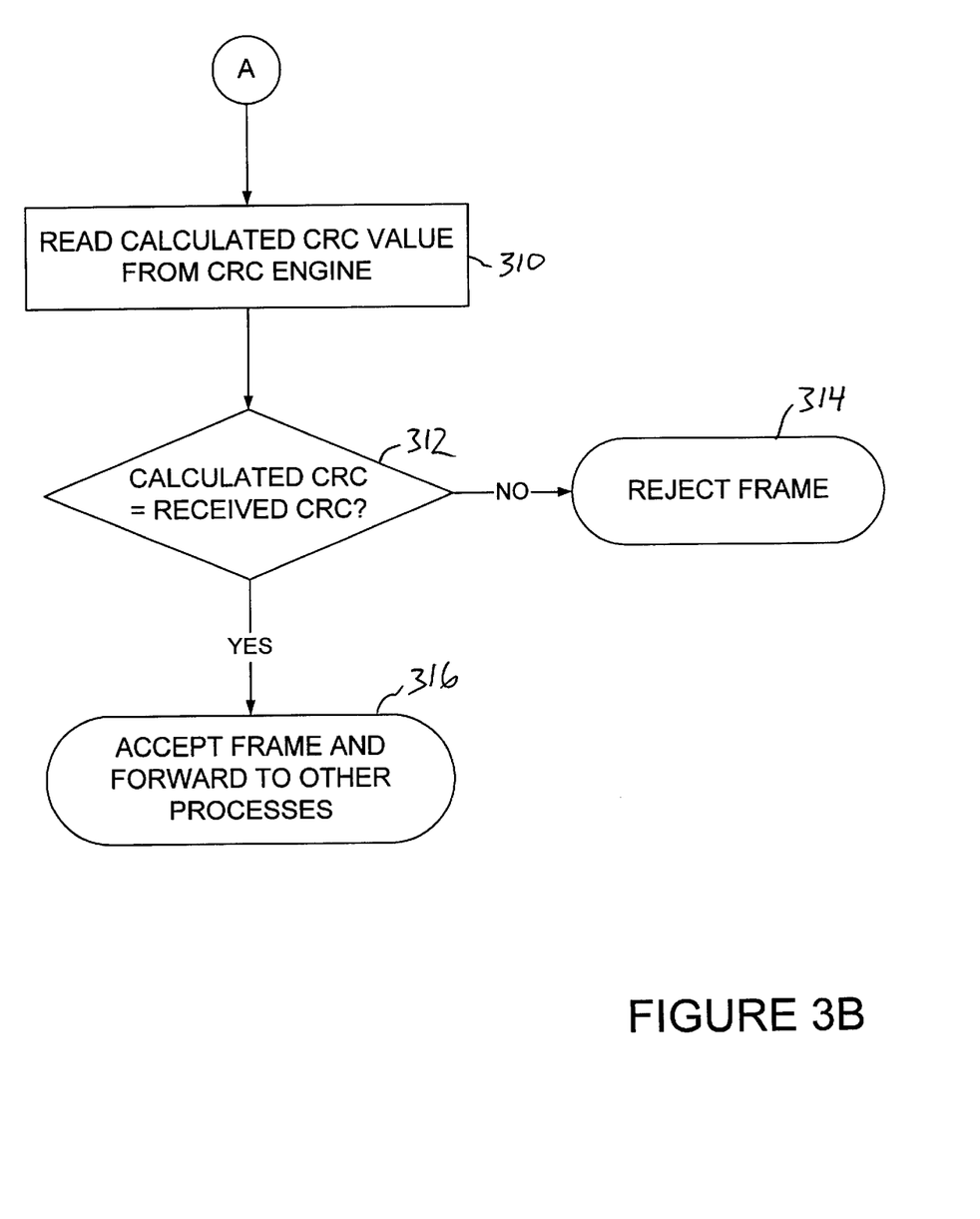

FIGS. 3A and 3B are flow diagrams of an exemplary frame header validation process performed by the cable modem 100 in accordance with the present invention. The process commences following receipt of one or more transport-layer frames in step 300. The received transport-layer frame is placed in a transport-layer buffer in step 202 using a direct memory access operation, and the appropriate software (e.g., the programmable MAC) is notified. The transport-layer buffer may be located in memory provided in any portion of the cable modem 100.

Next, in step 304, software locates and extracts header information from the receive transport-layer frame. The CRC engine 102 is then initialized with information necessary to perform a CRC operation on the extracted header information. In the disclosed embodiment, the initialization information is written to configuration register 106, and may include the desired CRC polynomial as well as initial vector (IV) information. The initialization information provided to the configuration register 106 may be inverted before being stored. Alternatively, if continuing a CRC operation, the previous result can be rewritten to the configuration register 106 to initialize it to the correct state. It is contemplated that initialization step 306 may be performed at any point in the illustrated process prior to the actual calculation of a CRC value.

Next, in step 308, the extracted header information is written to the data register 104 of the CRC engine 102. The write operation may be controlled by the programmable MAC 108 or another software process. As set forth in greater detail below in conjunction with FIG. 4, upon receiving data the CRC engine 102 performs the designated CRC operation and provides the output to a register accessible by the programmable MAC. The software process reads the calculated CRC value in step 310 (FIG. 3B). A final or intermediate CRC result can be read at any time in step 310 by reading the appropriate output register.

The process continues in step 312 where the programmable MAC 108 compares the calculated CRC value retrieved in step 310 to the CRC value extracted, for example, in step 304. If the CRC values do not match, a command is generated in step 314 to reject the incumbent frame. If the CRC values match, as determined in step 312, the process continues to step 316 and the frame is accepted and forwarded to other processes.

Figure 4:
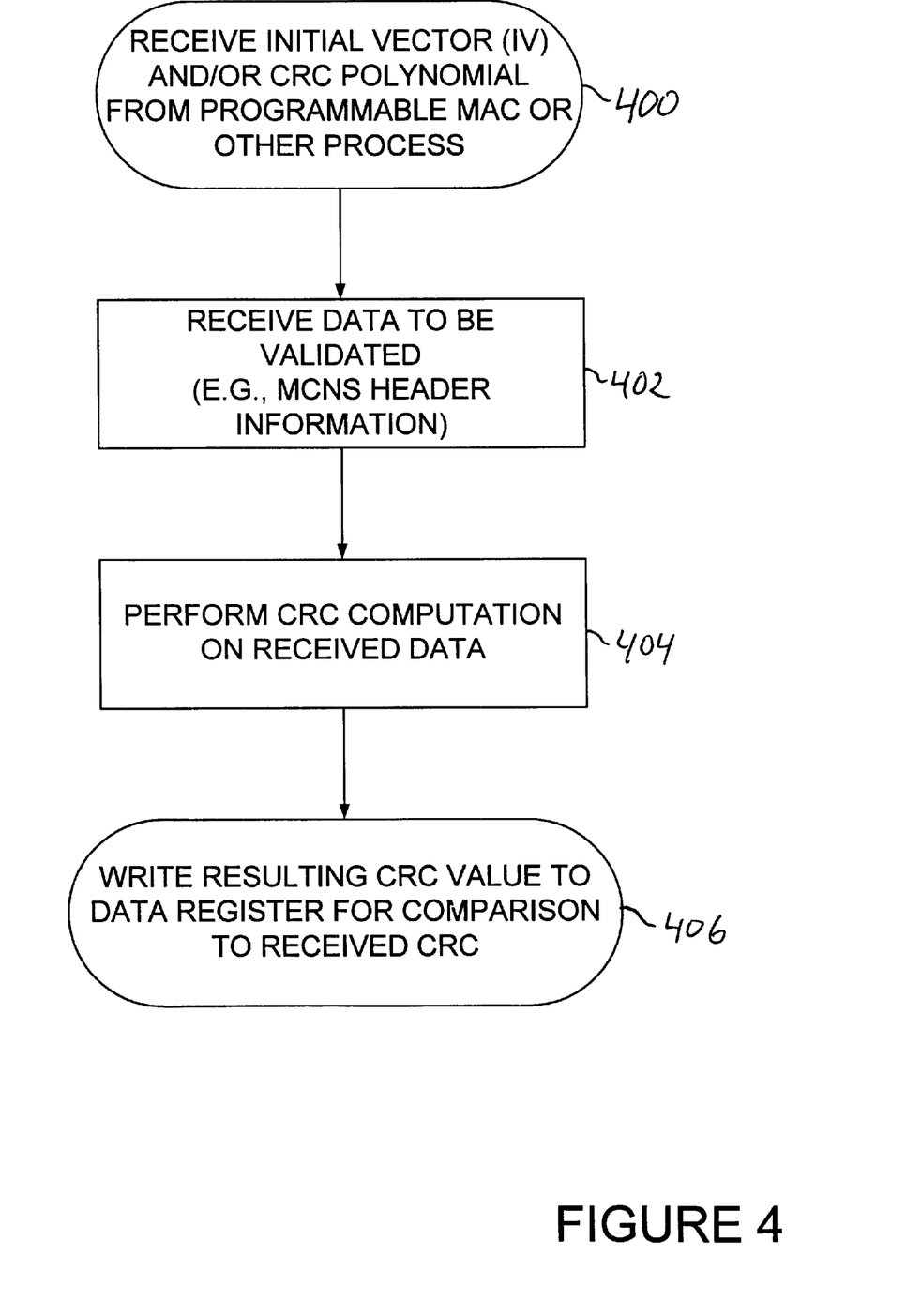
FIG. 4 is a flow diagram of an exemplary programmable CRC process according to the present invention for validating data frames such as that illustrated in FIG. 2.

FIG. 4 is a flow diagram of an exemplary programmable CRC process performed by the CRC engine 102 in accordance with the present invention. The disclosed process may be used to validate data frames such as the data frame 200 illustrated in FIG. 2. The validation process of FIG. 4 is conducted each time a data value is written to the data register 104. In the disclosed embodiment of the invention, the validation process of FIG. 4 is performed by the CRC engine 102 in a single clock cycle of the peripheral bus 110.

The CRC engine 102 may be utilized in both downstream and upstream communications, and is generally intended to operate on small amounts of data transferred by the programmable MAC 108. In one embodiment of the invention, the HCS operation utilizes the CRC/CCITT polynomial: $X^{16}+X^{12}+X^5+X^1$, as defined in ITU-T X.25.

Data of varying sizes may be provided to the data register 104. For example, any byte, word, or dword write to the data register 104 may be defined as legal. In one embodiment of the invention, data is shifted into the data register 104 in bit-little-endian format (the LSB is shifted first) as well as byte-little-endian mode (the least significant byte is shifted first).

The validation process of FIG. 4 commences in step 400, where initialization information is written to the configuration register 106. The initialization information, as previously noted, may include an initial CRC vector and/or criteria for determining the type of CRC to be computed. For example, DVD-compliant systems perform HCS operations, but use a different CRC polynomial that DOCSIS-compliant systems. The programmable nature of the CRC engine 102 allows it to support either type of system. Configuration information may be provided by the programmable MAC 108 or other software process.

Next, in step 402, the data to be validated (e.g., MCNS header information) is received by the data register 104. The validation process continues in step 404 where a CRC computation is performed on the receive data in accordance with the initialization information provided in step 400. Finally, in step 406, the resulting CRC value is written to an output data register for comparison to a received CRC value. Alternatively, the comparison process may occur in the CRC engine 102 itself, in which case a valid/invalid bit may be set.

Thus, a communication device (such as a cable modem) has been described having a programmable MAC supported by a programmable CRC engine. The CRC engine efficiently computes CRC values for data written to it by the programmable MAC or other software process, thereby relieving processing circuitry of these computationally burdensome functions. The CRC engine may advantageously utilize one or more polynomials as determined by the programmable MAC. Further, the CRC engine of the disclosed embodiment may receive data of varying sizes such that write processes may be optimized. The programmable nature of the CRC engine permits compliance with a wide variety standards, including evolving standards such as DOCSIS, without requiring expensive hardware upgrades.

In view of the above detailed description of the present invention and associated drawings, other modifications and variations will now become apparent to those skilled in the art. It should also be apparent that such other modifications and variations may be effected without departing from the spirit and scope of the present invention.

We claim:

1. A communication device configured to operate as a cable modem, comprising:

a data media interface for receiving a data frame;

a programmable media access controller coupled to the data media interface; and a cyclic-redundancy-check (CRC) engine configurable to generate a CRC value in less than eight clock cycles for at least a portion of the data frame in accordance with configuration information generated by the programmable media access controller, wherein the programmable media access controller is substantially compliant with a Data Over Cable Service Interface Specification (DOCSIS).

2. The communication device of claim 1, the CRC engine further comprising:

at least one data register for receiving the at least a portion of the data frame; and at least one configuration register for receiving the configuration information.

3. The communication device of claim 1, wherein the configuration information comprises a CRC initial vector to be utilized by the CRC engine.

4. The communication device of claim 1, wherein the configuration information identifies a CRC polynomial to be utilized by the CRC engine.

5. The communication device of claim 1, further comprising processing circuitry programmable to implement the programmable media access controller.

6. The communication device of claim 5, wherein the processing circuitry comprises a host system processor.

7. The communication device of claim 1 manufactured as an integrated circuit.

8. The communication device of claim 1 wherein the CRC value is generated in 4 or less clock cycles.

9. The communication device of claim 1 wherein the CRC value is generated in 1 or less clock cycles.

10. A communication device configured to operate as a cable modem, comprising:

a data media interface for receiving a data frame;

a programmable media access controller coupled to the data media interface; and a cyclic-redundancy-check (CRC) engine configurable to generate a CRC value in less than eight clock cycles for at least a portion of the data frame in accordance with configuration information generated by the programmable media access controller wherein the programmable media access controller and CRC engine are substantially compliant with the Digital Video Broadcasting (DVB) standard.

11. A communication device configured to operate as a cable modem, comprising:

a data media interface for receiving a data frame;

a programmable media access controller coupled to the data media interface;

a cyclic-redundancy-check (CRC) engine configurable to generate a CRC value in less than eight clock cycles for at least a portion of the data frame in accordance with configuration information generated by the programmable media access controller;

a peripheral bus, the data media interface and CRC engine coupled to the peripheral bus;

a system bus, the processing circuitry coupled to the system bus; and a bridge circuit communicatively linking the peripheral bus and the system bus.

12. The communication device of claim 11, further comprising:

at least one peripheral circuit coupled to the peripheral bus, the peripheral circuit having a physical interface to an external communications bus.

13. The communication device of claim 11, wherein the peripheral bus and the system bus are substantially compliant with the Advanced Microcontroller Bus Architecture (AMBA) specification.

14. A method for performing a cyclic-redundancy-check (CRC) on at least a portion of a data frame, comprising:

placing the data frame in a buffer;

extracting a portion of the data frame;

providing the portion of the data frame to a programmable CRC engine; and the programmable CRC engine performing a CRC operation on the portion of the data frame to generate a CRC value in less than eight clock cycles.

15. The method of claim 14, further comprising:

providing configuration information to the programmable CRC engine prior to the step of performing a CRC operation.

16. The method of claim 15, wherein the configuration information comprises a CRC initial vector and/or a CRC polynomial.

17. The method of claim 14, further comprising:

comparing the result of the CRC operation to a second portion of the data frame.

18. The method of claim 14, wherein the steps of extracting a portion of the data frame and providing the portion of the data frame to a programmable CRC engine are performed by a programmable media access controller.

19. The method of claim 14, wherein the programmable media access controller is substantially compliant with a Data Over Cable Service Interface Specification (DOCSIS).

20. The method of claim 14 wherein the CRC value is generated in 4 or less clock cycles.

21. The method of claim 14 wherein the CRC value is generated in 1 or less clock cycles.

22. A computer system, comprising:

a data media interface for receiving a data frame;

a programmable media access controller coupled to the data media interface; and a cyclic-redundancy-check (CRC) engine configurable to generate a CRC value in less than eight clock cycles for at least a portion of the data frame in accordance with configuration information generated by the programmable media access controller, wherein the programmable media access controller is substantially compliant with a Data Over Cable Service Interface Specification (DOCSIS).

23. The computer system of claim the 22, CRC engine further comprising:

at least one data register for receiving the at least a portion of the data frame; and at least one configuration register for receiving the configuration information.

24. The computer system of claim 22, wherein the programmable media access controller is implemented by a host processor.

25. The computer system of claim 22, wherein the configuration information comprises a CRC initial vector to be utilized by the CRC engine.

26. The computer system of claim 22 wherein the CRC value is generated in 4 or less clock cycles.

27. The computer system of claim 22 wherein the CRC value is generated in 1 or less clock cycles.

* * * * *